United States Patent
St. Germain et al.

(10) Patent No.: US 7,495,323 B2
(45) Date of Patent: Feb. 24, 2009

(54) SEMICONDUCTOR PACKAGE STRUCTURE HAVING MULTIPLE HEAT DISSIPATION PATHS AND METHOD OF MANUFACTURE

(75) Inventors: Stephen St. Germain, Scottsdale, AZ (US); Phillip Celaya, Gilbert, AZ (US); Roger Arbuthnot, Mesa, AZ (US); Francis J. Carney, Queen Creek, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 328 days.

(21) Appl. No.: 11/468,542

(22) Filed: Aug. 30, 2006

(65) Prior Publication Data

US 2008/0054438 A1    Mar. 6, 2008

(51) Int. Cl.
*H01L 23/495* (2006.01)
*H01L 21/00* (2006.01)
*H05K 7/20* (2006.01)

(52) U.S. Cl. .................. 257/676; 257/707; 257/713; 257/787; 257/797; 257/E23.052; 257/E23.179; 438/122; 438/123; 438/127; 438/462; 361/707; 361/709

(58) Field of Classification Search ............... None
See application file for complete search history.

(56) References Cited

U.S. PATENT DOCUMENTS

| 6,630,726 | B1 | 10/2003 | Crowley et al. |
| 7,166,496 | B1 * | 1/2007 | Lopez et al. ............... 438/110 |
| 7,238,551 | B2 | 7/2007 | Kasem et al. |
| 7,394,150 | B2 * | 7/2008 | Kasem et al. ............... 257/690 |
| 2003/0075786 | A1 * | 4/2003 | Joshi et al. ............... 257/676 |
| 2006/0108671 | A1 | 5/2006 | Kasem et al. |

OTHER PUBLICATIONS

Data Sheet, "N-Channel 30-V (D-S) MOSFET", Vishay Siliconix, SiE800DF, Document No. 73199, S-52261—Rev. C., Oct. 24, 2005, 7 pages.
Data Sheet, "PolarPAK Solder Joint Reliability Based on Thermql Fatique IPC-9701", Vishay Siliconix, Document No. 73507, Aug. 31, 2005, 17 pages.

* cited by examiner

*Primary Examiner*—Alonzo Chambliss
(74) *Attorney, Agent, or Firm*—Kevin B. Jackson

(57) ABSTRACT

In one embodiment, a semiconductor package structure includes a conductive bridge having coupling portions on opposing ends. A lead frame includes alignment or receiving features for receiving the coupling portions of the bridge. A semiconductor device is attached to both the conductive bridge and the lead frame, and is configured so that the coupling portions are on opposing sides of the semiconductor device.

18 Claims, 4 Drawing Sheets

SEMICONDUCTOR PACKAGE STRUCTURE HAVING MULTIPLE HEAT DISSIPATION PATHS AND METHOD OF MANUFACTURE

FIELD OF THE INVENTION

This invention relates generally to electronic devices, and more specifically to semiconductor packages and methods of assembly.

BACKGROUND OF THE INVENTION

The packaging of semiconductor components such as power semiconductor devices involves a number of design challenges. Such challenges include cost, heat dissipation, device protection, size, performance, and reliability among others. Examples of prior art power packages that have been developed and improved upon to address such issues include the TO-220, TO-218, CASE 77, TO-247, Dpak, $D^2$pak, $D^3$pak, quad flat pack no-lead (QFN), quad flat pack (QFP), small outline (SOP) packages among others.

Power semiconductor device manufacturers have recently introduced new power device packages that provide heat dissipation paths from both top and bottom surfaces of the package. The dual heat dissipation paths provide, among other things, increased current density compared to conventional single dissipation path packages, and improved junction-to-ambient thermal impedance. In addition, the dual heat dissipation path packages can either handle more power or operate with a lower junction temperature compared to single heat dissipation path packages. A lower junction temperature means a lower drain to source on-resistance for MOSFET devices, which in turn provides a higher efficiency packaged component. A reduction in junction temperature means an increase in product reliability.

Although the new dual heat dissipation path packages provide some operating advantages compared to other prior art packages, several manufacturing challenges still exist that prevent these packages from being optimally reliable and cost effective. Such challenges include exposed semiconductor die surfaces, inconsistent alignment of piece parts and components, non-standard piece part designs that require expensive assembly tool modifications, and the need for component masking and shimming steps.

Accordingly, a need exists for a package structure and method of manufacture that addresses these specific challenges as well as others.

Figure 1:
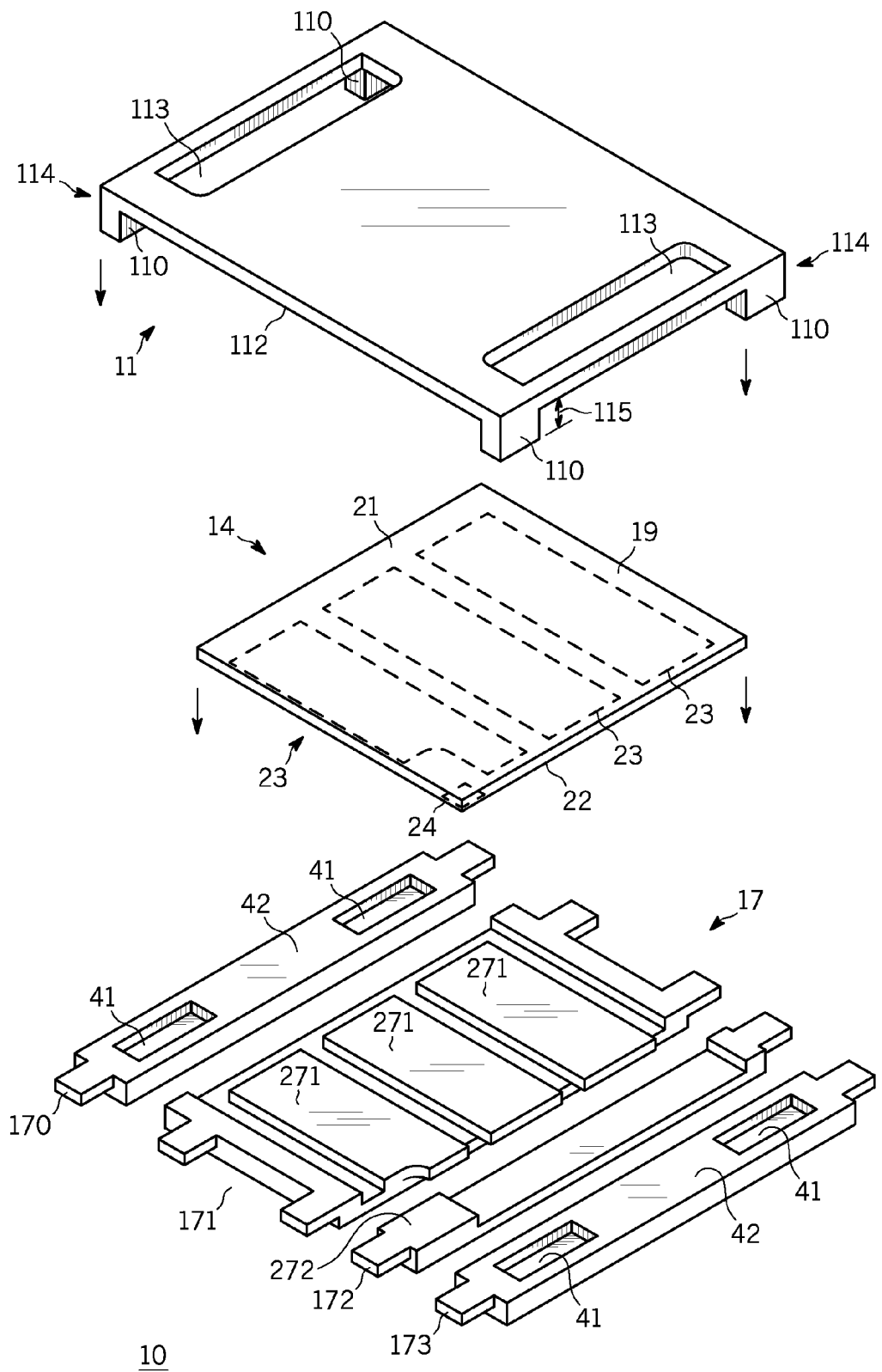
FIG. 1 illustrates an exploded isometric view of a portion of a semiconductor package sub-assembly structure in accordance with a first embodiment.

For ease of understanding, elements in the drawing figures are not necessarily drawn to scale, and like element numbers are used where appropriate throughout the various figures to denote the same or similar elements. Although the present invention is described below in a power transistor configuration having three electrodes, those skilled in the art understand that the present invention is applicable to other semiconductor devices as well.

DETAILED DESCRIPTION OF THE DRAWINGS

FIG. 1 shows an exploded isometric view of a portion of a semiconductor package sub-assembly structure 10 in accordance with a first embodiment. In this embodiment, structure 10 comprises a conductive bridge, plate, connective clip, first current carrying structure, or connective bridge 11, a semiconductor device or electronic device 14, and a lead frame or conductive support structure 17.

By way of example, semiconductor device 14 comprises a semiconductor device such as a power MOSFET, insulated gate bipolar transistor, a bipolar transistor, a JFET device, a MESFET device, a thyristor, a diode, or the like. Semiconductor device 14 is shown with a current carrying electrode 19 formed overlying a major surface 21, and a major surface 22 that includes second current carrying electrodes 23 (shown in phantom). Major surface 22 further includes a control electrode 24 (shown in phantom). In one embodiment, current carrying electrode 19 corresponds to a drain electrode, current carrying electrodes 23 correspond to source electrodes, and control electrode 24 corresponds to a gate electrode corresponding to a MOSFET device. In this embodiment, semiconductor device 14 is oriented in a "drain up" or "source down" configuration in structure 10. By way of example, current carrying electrodes 19 and 23 comprise a metal such as aluminum, an aluminum alloy, titanium/nickel/silver, titanium/nickel/gold, chrome/nickel/gold, or the like for attaching to plate 11 and lead frame 17.

Conductive plate 11 and lead frame 17 comprise a conductive material such as copper, a copper alloy, plated copper, a plated or coated plastic, or the like. Examples of suitable plated or coating materials include silver and/or tin. In one embodiment, plate 11 includes alignment structures, stand-offs, coupling devices, placement structures, or planarity control devices 110 formed on or extending from a major surface 112 of plate 11. In one embodiment, plate 11 has coupling devices 110 at opposing ends 114 as shown in FIG. 1. In one embodiment, coupling devices 110 comprise square or rectangular like blocks or block portions formed at or in proximity to the four corners of plate 11. In one embodiment, coupling devices 110 are substantially perpendicular to plate 11 to provide a more resilient stand-off feature that promotes better height and planarity control for structure 10.

Coupling devices 110 extend from major or inside surface 112 a distance that is determined based on the thickness of semiconductor device 14 as well as stack-up dimensions or tolerances of lead frame 17. In one embodiment, coupling devices 110 extend a distance 115 on the order of about 0.30 millimeters (mm). In another embodiment, plate 11 further includes cut-outs or mold lock portions 113, which are configured to lock with an encapsulating layer 39 (shown in FIG. 3).

Lead frame 17 comprises a plurality of portions or components including paddles, bond portions, beam portions, elongated pads, support pads, or pad portions 170, 171, 172, and 173. In one embodiment, pad portions 170 and 173 correspond to one current carrying electrode of structure 10 and configured to provide electrical contact between current carrying electrode 19 to an opposite surface or side of structure 10. In this embodiment, pad portions 170 and 173 correspond to drain contacts for structure 10. Pad portions 170 and 173 are configured to include alignment features or portions, clip attach portions, receiving structures, coupling portions, or mating portions 41. Alignment portions 41 are configured to receive coupling devices 110 of plate 11 to provide a consistent and enhanced alignment and planarity feature for structure 10. That is, plate 11 and alignment features 41 are configured to control the planarity of plate 11 with respect to major surface 21 of semiconductor device 14.

Figure 2:
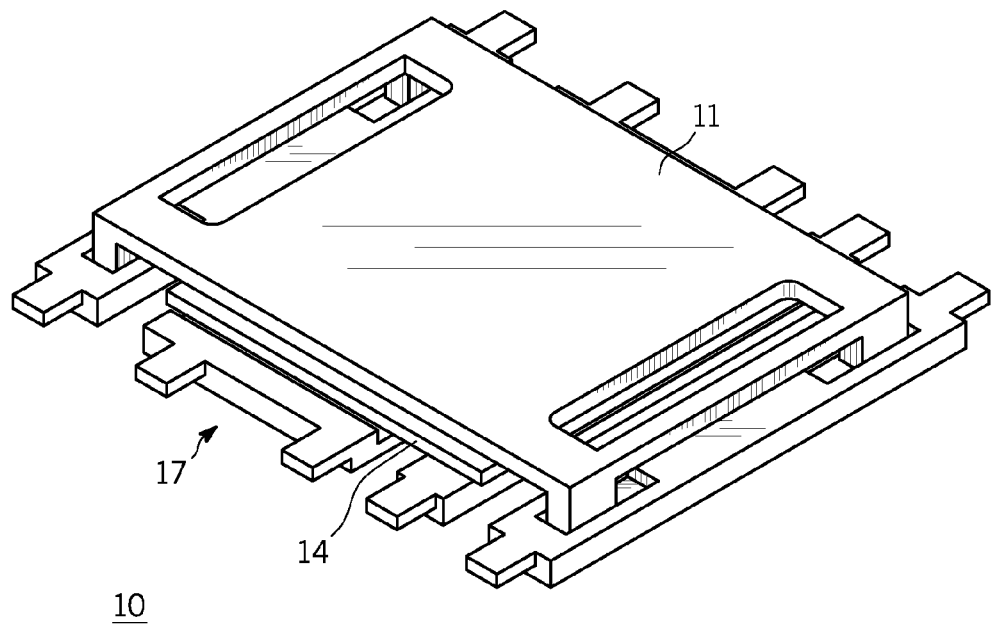
FIG. 2 illustrates an isometric view of the structure FIG. 1 after an intermediate step in fabrication.

In one embodiment, alignment portions 41 comprise wells, trenches channels or troughs formed in major surface 42. By way of example, alignment portions have a depth of about 0.13 mm. This depth is adjusted according to the height of coupling device 110 and the stack-up dimensions of lead frame 17, semiconductor die 14, and the attachment or bonding materials used to hold or bond structure 10 together. In this embodiment, portions of coupling devices 110 are physically within alignment portions 41 as shown in FIG. 2.

Coupling devices 110 and/or alignment portions 41 are configured to provide enhanced alignment of plate 11 to lead frame 17, and to further provide enhanced planarity control of plate 11 with respect to semiconductor 14. That is, coupling devices 110 provide a built-in stop feature with alignment portions 41 as pressure is applied to plate 11 during assembly. These features ensure a more consistent bond line along the interface between plate 11 and semiconductor device 14, which enhances the manufacturability and reliability of structure 10. Additionally, these features allow the use of less solder during assembly, which saves on manufacturing costs. Further, these features provide for a simplified molding process because they provide a more consistent sub-assembly height and planarity, they eliminate the need to tape the outer surface of plate 11 during molding, plus they eliminate the need to use shims or spacers during molding. This reduces assembly time and costs. Moreover, these features eliminate the need to use expensive deflashing processes, which are required in prior art packages to remove unwanted encapsulating.

Pad portion 172 is configured in this embodiment as a control electrode contact or gate electrode contact. In one embodiment, pad portion 172 includes an elevated contact portion or pedestal 272 configured or placed to couple with or bond to control electrode 24 of semiconductor device 14. Although elevated contact portion 272 is shown on one side of pad portion 172, it is understood that elevated portion 272 may be placed elsewhere to accommodate specific design requirements.

Pad portion 171 is configured to electrically couple to current carrying electrodes 23 of semiconductor device 14. In one embodiment, this configuration is achieved using one or more pedestals or raised platform portions 271. Although not shown, it is understood that lead frame 17 may comprises a plurality of pad portions 170, 171, 172, and 173 in a matrix structure to facilitate the fabrication of multiple components. Additionally, it is understood that in one embodiment, pad portions 170, 171, 172, and 173 are held together with a frame and tie bar portions, which are subsequently removed during the assembly process. These conventional structures are not shown in FIG. 1 to simplify the description.

Figure 3:
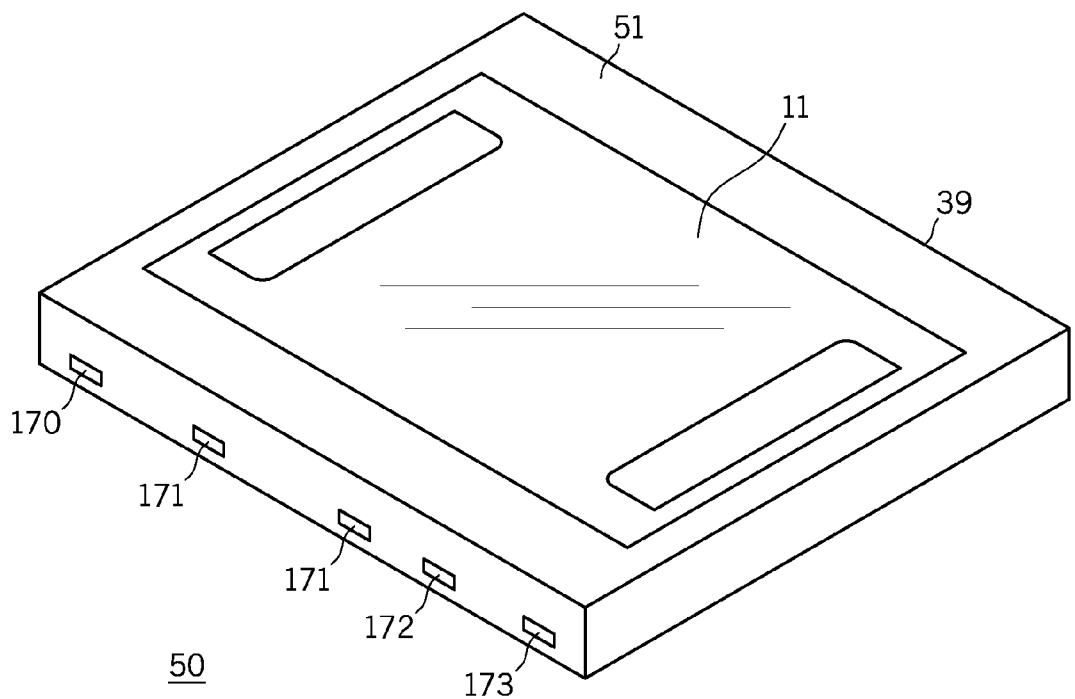
FIG. 3 illustrates an isometric view of one major surface of the semiconductor package of FIG. 2 after further assembly.
Figure 4:
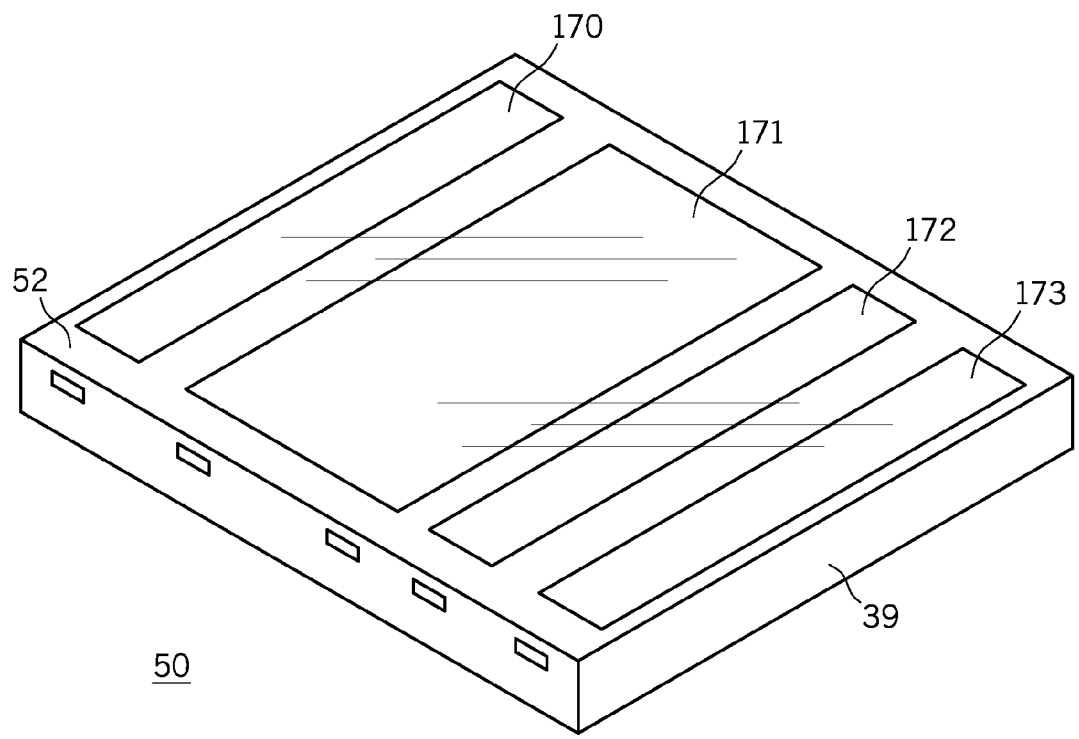
FIG. 4 illustrates an isometric view of another major surface of the semiconductor of FIG. 2 after further assembly.

FIG. 2 is an isometric view of structure 10 after the components described above are assembled. By way of example, lead frame 17 is placed on an adhesive assembly tape, and major surface 22 of semiconductor device 14 is oriented and attached to desired portions of lead frame 17 using for example, a screened solder paste, a solder perform, or conductive epoxy material. Next, plate 11 having coupling portions 110 is oriented and attached to major surface 21 of semiconductor device 14 and attached to alignment portions 41 of pad portions 170 and 171 using a solder or epoxy attach material. Suitable solder attach materials include, for example, lead free solders, a tin/lead/silver solder, or the like. Sub-assembly 10 is then subject to an elevated temperature to reflow the solder or cure the epoxy attach materials. Next, sub-assembly 10 is placed in a molding apparatus to form an encapsulating layer 39 as shown in FIGS. 3 and 4.

As described above, because the features of plate 11 having coupling portions 110 and alignment portions 41 provide for a more consistent and planar subassembly 10, the outer surface of plate 11 does not need to be taped or shimmed during the molding process, which simplifies the molding process. By way of example, encapsulating layer 39 comprises an epoxy resin material. In one embodiment where lead frame 17 comprises a matrix of components and a plurality of semiconductor devices 14, the entire lead frame 17 is over-molded to provide a continuous encapsulating layer 39. The molded matrix is then singulated through encapsulating layer 39 and lead frame 17 to provide a plurality of assembled components or packaged semiconductor devices 50 as shown in FIGS. 3 and 4, which are isometric views of opposing major surfaces 51 and 52 the package after encapsulating layer 39 is formed. As shown in FIG. 2, coupling portions 110 and alignment features 41 are on or in proximity to at least two opposing sides of semiconductor device 14 to provide enhanced planarity control between plate 11 and semiconductor device 14.

Packaged semiconductor device 50 comprises a multiple thermal or heat dissipation path device because heat is dissipated out of both surfaces 51 and 52. Specifically, heat is dissipated through plate 11 exposed at or on surface 51, and through pad portions 170, 172, and 173 exposed on opposite surface 52. In one embodiment, surface 52 is mounted to a next level of assembly such as a printed circuit board and heat is dissipated through the printed circuit board. In an optional embodiment, a heat sinking device is attached to plate 11 on surface 51 to provide for additional heat dissipation.

Figure 5:
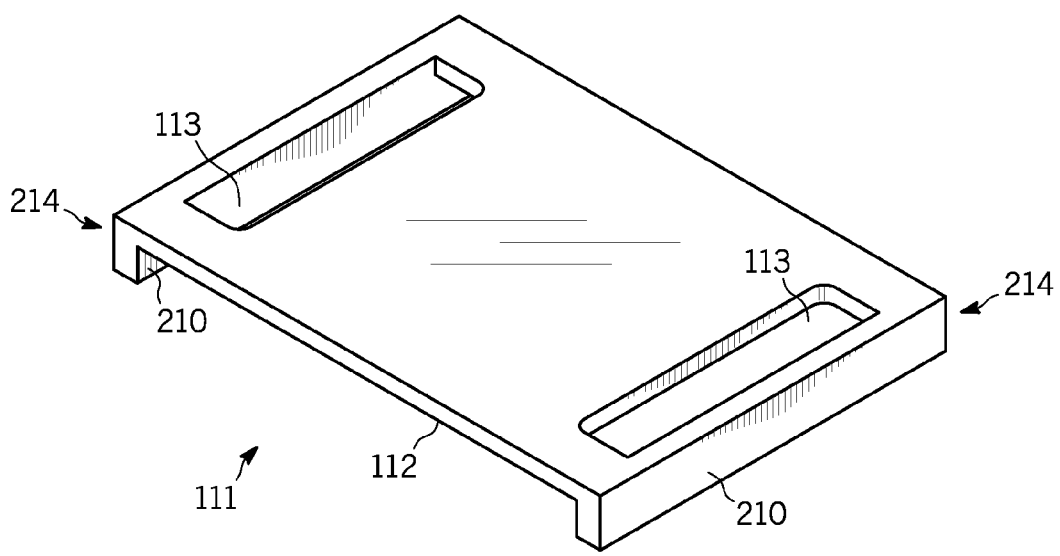
FIG. 5 illustrates an isometric view of an alternative embodiment of a clip structure.
Figure 6:
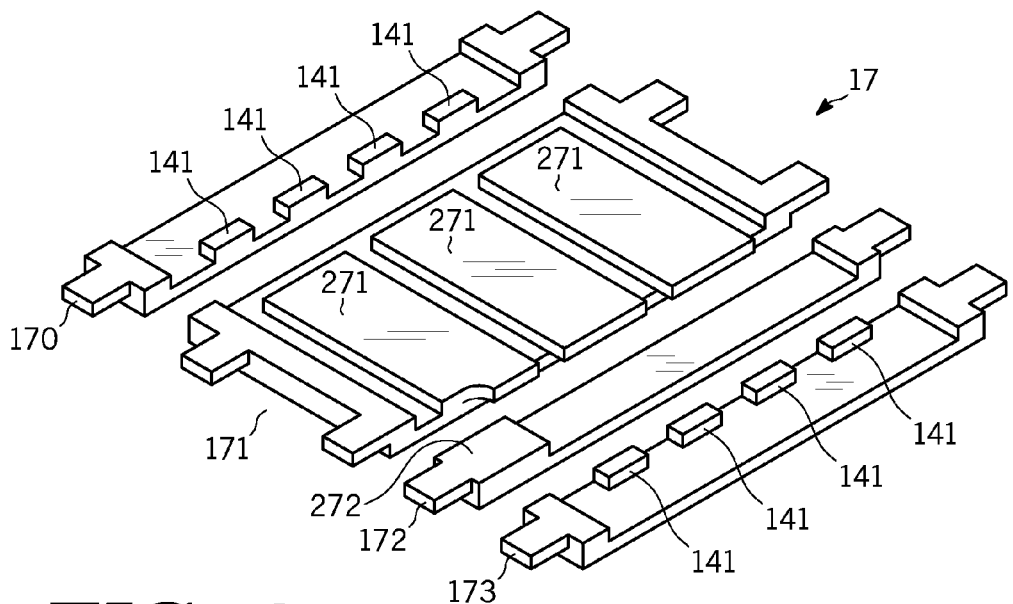
FIG. 6 illustrates an isometric view of an alternative embodiment of a lead frame structure.
Figure 7:
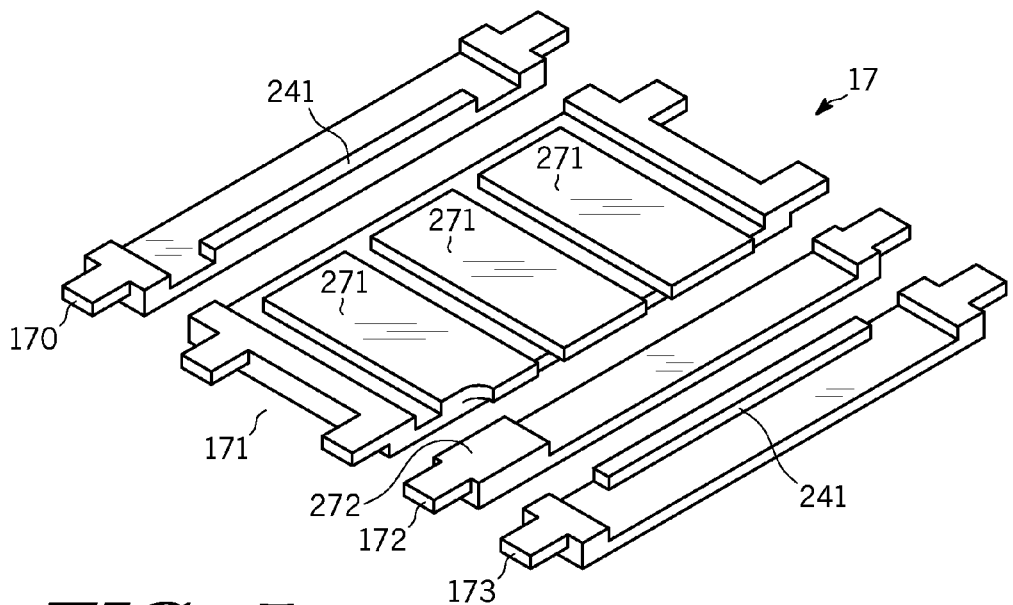
FIG. 7 illustrates an isometric view of further embodiment of a lead frame structure.

Turning now to FIGS. 5-7, alternative embodiments will now be described. FIG. 5 shows an isometric view of an alternative embodiment of a bridge or clip portion 111. Plate 111 similar to plate 11 except that plate 111 includes continuous beam, end, or beam portions 210 extending away from major or inside surface 112. In one embodiment, plate 111 has beam portions 210 at opposing ends 214 as shown in FIG. 5 so that beam portions are on at least two opposing sides of semiconductor device 14.

Figure 8:
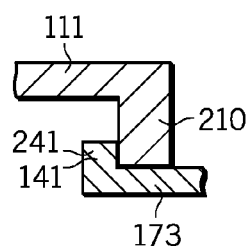
FIG. 8 illustrates a partial cross-section view of a portion of the structures of FIGS. 5, 6, and 7.

FIGS. 6 and 7 show alternative embodiments of lead frame 17 with alignment features 141 and 241 respectively for use with plate 111. Alignment features 141 comprise a plurality of spaced apart pedestals or blocks formed on pad portions 170 and 173. Alignment features 241 comprise a single continuous raised portion or pedestal formed on pad portions 170 and 173. When plate 111 is attached to lead frame 17, alignment features 141 or 241 are on one side only of coupling portions 210 of plate 111 as shown in FIG. 8, which is a partial cross-sectional view of plate 111 and pad portion 173.

Thus, it is apparent that there has been provided a structure and method for forming a semiconductor package. The package incorporates a conductive connective bridge having coupling portions on opposing ends of the bridge that align or mate to alignment features formed on a lead frame. The coupling portions and the alignment features function, among other things, to improve the planarity between the conductive bridge and an electronic device contained within the package.

These features improve the assembly process, reduce costs, and improve the reliability of the package component.

Although the invention has been described and illustrated with reference to specific embodiments thereof, it is not intended that the invention be limited to these illustrative embodiments. For example, other shapes may be used for the coupling portions and the alignment features.

What is claimed is:

1. A semiconductor package structure having multiple heat dissipation paths comprising:
    a semiconductor component having first and second opposing surfaces;
    a conductive support structure having a plurality of support pads, wherein the first surface of the semiconductor component is coupled to one or more of the plurality of support pads and wherein at least two of the support pads have an alignment structure formed therein;
    a conductive connective bridge coupled to the second surface of the semiconductor component, wherein the conductive connective bridge comprises coupling portions on opposing ends, and wherein the coupling portions are aligned to the alignment structure on at least two support pads, and wherein the coupling portions extend from a major surface of the conductive connective bridge, and wherein the coupling portions are in physical contact with the alignment structures without an intervening material, and wherein the coupling portions and the alignment structures are configured to enhance planarity between the conductive connective bridge and semiconductor component; and
    an encapsulating layer passivating portions of the semiconductor package structure while leaving portions of the conductive connective bridge and portions of the plurality of supports pads exposed to provide the multiple heat dissipation paths.

2. The structure of claim 1, wherein the coupling portions comprise rectangular like blocks having sides that are substantially perpendicular to the conductive connective bridge.

3. The structure of claim 2, wherein the blocks are each in proximity to corners of the conductive connective bridge.

4. The structure of claim 1, wherein the coupling portions comprise continuous beam portions extending away from an inside surface of the conductive connective bridge.

5. The structure of claim 1, wherein the alignment portions comprise wells formed in major surfaces of the at least two support pads.

6. The structure of claim 5, wherein portions of the coupling portions are physically within the wells.

7. The structure of claim 1, wherein the alignment portions comprise a plurality of spaced apart block portions.

8. The structure of claim 7, wherein the coupling portions are on one side only of the alignment portions.

9. The structure of claim 1, wherein the alignment portions comprise a single continuous raised pedestal.

10. The structure of claim 9, wherein the coupling portions are on one side only of the alignment portions.

11. A semiconductor package structure comprising:
    a lead frame having a plurality of beam portions, wherein at least two beam portions include receiving structures formed thereon;
    a semiconductor device having first and second opposed major surfaces, wherein the semiconductor device has a first current carrying electrode on the first surface, and wherein the first current carrying electrode is attached to a first beam portion, and wherein the second major surface comprises a second current carrying electrode;
    a conductive plate having coupling portions extending from one surface, wherein the one surface is coupled to the second major surface of the semiconductor device so that the coupling portions are on two opposing sides of the semiconductor device, and wherein the coupling portions are in physical contact with the alignment structures without an intervening material, and wherein the coupling portions are configured to couple with the receiving structures to enhance planarity between the conductive plate and the semiconductor device; and
    an encapsulating layer formed over portions of the semiconductor package leaving portions of the conductive plate and portions of the beam portions exposed.

12. The package of claim 11, wherein the first beam includes at least one pedestal for coupling to the first current carrying electrode.

13. The package of claim 11, wherein the semiconductor device further comprises a control electrode formed on the first surface, and wherein the control electrode is coupled to a second beam portion adjacent the first beam portion, and wherein the first and second beam portions are between the at least two beam portions having the receiving structures.

14. The package of claim 11, wherein the receiving structures comprise wells, spaced apart pedestals, or single continuous pedestals.

15. The package of claim 11, wherein the coupling portions comprise rectangular like blocks formed in proximity to four corners of the conductive plate.

16. The package of claim 11, wherein the coupling portions are each on one side only of the receiving structures.

17. A method of forming a semiconductor package comprising the steps of:
    providing a lead frame having a plurality of beam portions, wherein at least two beam portions include alignment structures formed thereon;
    attaching a semiconductor device having first and second opposed major surfaces and a first current carrying electrode on the first surface to a first beam portion, and wherein the second major surface comprises a second current carrying electrode;
    attaching a conductive plate to the second major surface of the semiconductor device, wherein the conductive plate has coupling portions extending from one surface, and wherein the attaching step includes attaching the coupling portions to the alignment structures so that the coupling portions are on two opposing sides of the semiconductor device and in physical contact with the alignment structures without an intervening material during the step of attaching the coupling portions to the alignment structures so as to provide a built-in stop feature between the coupling portions and the alignment structures; and
    forming an encapsulating layer formed over portions of the semiconductor package leaving portions of the conductive plate and portions of the beam portions exposed.

18. The method of claim 17, wherein the step of providing the lead frame includes providing a lead frame wherein the alignment structures comprise wells, spaced apart pedestals, or single continuous pedestals.

* * * * *